(12) United States Patent
Zhou

(10) Patent No.: US 11,107,862 B2
(45) Date of Patent: Aug. 31, 2021

(54) PIXEL UNIT, DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Weilong Zhou, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/345,256

(22) PCT Filed: Oct. 12, 2018

(86) PCT No.: PCT/CN2018/109949
§ 371 (c)(1),
(2) Date: Apr. 26, 2019

(87) PCT Pub. No.: WO2019/076242
PCT Pub. Date: Apr. 25, 2019

(65) Prior Publication Data
US 2019/0296092 A1    Sep. 26, 2019

(30) Foreign Application Priority Data
Oct. 17, 2017   (CN) .......................... 201710965515.9

(51) Int. Cl.
*H01L 27/32* (2006.01)
*G09G 3/20* (2006.01)
(Continued)

(52) U.S. Cl.
CPC .......... *H01L 27/3211* (2013.01); *G02B 5/003* (2013.01); *G09F 9/301* (2013.01);
(Continued)

(58) Field of Classification Search
CPC ...... G02B 5/003; G09F 9/301; G09G 3/2003; H01L 27/3211; H01L 27/322;
(Continued)

(56) References Cited

U.S. PATENT DOCUMENTS

2005/0116619 A1* 6/2005 Kuma .................. H01L 27/322
                                                    313/503
2005/0225233 A1  10/2005 Boroson et al.
(Continued)

FOREIGN PATENT DOCUMENTS

CN          1606387 A      4/2005
CN        101040397 A      9/2007
(Continued)

OTHER PUBLICATIONS

First Office Action for Chinese Patent Application No. 201710965515.9 dated Aug. 5, 2019.
(Continued)

*Primary Examiner* — Hong Zhou
(74) *Attorney, Agent, or Firm* — Calfee, Halter & Griswold LLP

(57) ABSTRACT

A pixel unit including a substrate; a first light emitting device, a second light emitting device and a third light emitting device on the substrate; and a light absorbing layer at a light exiting side of the first light emitting device or a light exiting side of the second light emitting device. The first light emitting device is configured to emit light of a first color, the second light emitting device is configured to emit light of a second color, the third light emitting device is configured to emit light of a third color. A degree of
(Continued)

attenuation of the light of the first color caused by a microcavity effect of the first light emitting device and a degree of attenuation of the light of the second color caused by a microcavity effect of the second light emitting device are smaller than a degree of attenuation of the light of the third color caused by a microcavity effect of the third light emitting device. The light absorbing layer is configured to absorb at least one of a portion of the light of the first color and a portion of the light of the second color.

12 Claims, 7 Drawing Sheets

(51) Int. Cl.
  *G09F 9/30* (2006.01)
  *G02B 5/00* (2006.01)
  *H01L 51/52* (2006.01)

(52) U.S. Cl.
  CPC .......... *G09G 3/2003* (2013.01); *H01L 27/326* (2013.01); *H01L 51/5206* (2013.01); *H01L 51/5221* (2013.01); *H01L 51/5284* (2013.01)

(58) Field of Classification Search
  CPC ............. H01L 27/326; H01L 51/5206; H01L 51/5221; H01L 51/5284
  See application file for complete search history.

(56) References Cited

U.S. PATENT DOCUMENTS

| | | | | |
|---|---|---|---|---|
| 2006/0158403 | A1* | 7/2006 | Kuma | H01L 51/5036 345/83 |
| 2007/0145350 | A1* | 6/2007 | Kobori | H01L 27/322 257/13 |
| 2008/0090325 | A1* | 4/2008 | Koenemann | C07D 471/06 438/99 |
| 2008/0093977 | A1 | 4/2008 | Bechtel et al. | |
| 2009/0091238 | A1 | 4/2009 | Cok et al. | |
| 2009/0186148 | A1* | 7/2009 | Kim | H01L 51/0013 427/66 |
| 2010/0001637 | A1 | 1/2010 | Satou | |
| 2012/0326180 | A1* | 12/2012 | Ohe | H01L 27/322 257/88 |
| 2014/0203271 | A1* | 7/2014 | Yoneda | H01L 51/5265 257/40 |
| 2014/0334143 | A1* | 11/2014 | Ishitani | H01L 27/3206 362/231 |
| 2015/0357602 | A1* | 12/2015 | Li | H01L 51/5284 257/40 |
| 2016/0300888 | A1 | 10/2016 | Wang et al. | |
| 2016/0359121 | A1* | 12/2016 | Ito | H01L 51/0085 |
| 2017/0104162 | A1 | 4/2017 | Rosselli et al. | |
| 2017/0162829 | A1* | 6/2017 | Lai | H01L 27/322 |
| 2017/0250377 | A1 | 8/2017 | Tokuda | |
| 2018/0156951 | A1* | 6/2018 | Baek | G02F 1/133617 |
| 2019/0296092 | A1 | 9/2019 | Zhou | |

FOREIGN PATENT DOCUMENTS

| | | |
|---|---|---|
| CN | 101874317 A | 10/2010 |
| CN | 103996696 A | 8/2014 |
| CN | 106132930 A | 11/2016 |
| CN | 107658331 A | 2/2018 |

OTHER PUBLICATIONS

Search Report and Written Opinion for International Application No. PCT/CN2018/109949 dated Jan. 11, 2019.

Bi Chang-dong, et al." Title: Influence of organic fluorescent material DCJTB on luminescent properties of white LED," Publication date: Nov. 30, 2011; p. 1660-1662, vol. 22, No. 11; Country of Publication: China; Journal of Optoelectronics—Laser.

* cited by examiner

PIXEL UNIT, DISPLAY PANEL AND DISPLAY DEVICE

CROSS REFERENCE TO RELATED APPLICATIONS

The present application is a 35 U.S.C. § 371 national stage application of PCT Application No. PCT/CN2018/109949, filed on Oct. 12, 2018, which claims priority to Chinese Patent Application No. 201710965515.9 filed on Oct. 17, 2017, the content of which are incorporated herein by reference in their entireties.

FIELD

The present disclosure relates to the field of display technologies, and in particular, to a pixel unit, a display panel, and a display device.

BACKGROUND

An Organic Light Emitting Diode (OLED) device is a device that emits light by applying an electric field to an organic material. It has many advantages, such as high contrast, short response time, applicability in ultra-thin flexible display products, etc.

With the rapid development of OLED display technology, some problems are exposed although the technology meets the customized needs of the users. For example, the color shift of white images of OLED display panel under different viewing angles is one of the main reasons restricting the further development of OLED display technology, which seriously affects the user experience.

SUMMARY

According to an exemplary embodiment, there is provided a pixel unit, comprising: a substrate; a first light emitting device, a second light emitting device and a third light emitting device on the substrate, wherein the first light emitting device is configured to emit light of a first color, the second light emitting device is configured to emit light of a second color, the third light emitting device is configured to emit light of a third color, and a degree of attenuation of the light of the first color caused by a microcavity effect of the first light emitting device and a degree of attenuation of the light of the second color caused by a microcavity effect of the second light emitting device are smaller than a degree of attenuation of the light of the third color caused by a microcavity effect of the third light emitting device; and a light absorbing layer at a light exiting side of the first light emitting device or a light exiting side of the second light emitting device, wherein the light absorbing layer is configured to absorb at least one of a portion of the light of the first color and a portion of the light of the second color.

In some exemplary embodiments, the light of the first color comprises red light, the light of the second color comprises green light, and the light of the third color comprises blue light.

In some exemplary embodiments, the light absorbing layer comprises at least one of a first light absorbing member at the light exiting side of the first light emitting device and a second light absorbing member at the light exiting side of the second light emitting device, wherein the first light absorbing member is configured to absorb said portion of the light of the first color and the second light absorbing member is configured to absorb said portion of the light of the second color.

In some exemplary embodiments, an orthographic projection of the first light absorbing member on the substrate at least partially coincides only with an orthographic projection of the first light emitting device on the substrate, and an orthographic projection of the second light absorbing member on the substrate at least partially coincides only with an orthographic projection of the second light emitting device on the substrate.

In some exemplary embodiments, the first light absorbing member and the second light absorbing member are at the same layer.

In some exemplary embodiments, an orthographic projection of the first light absorbing member on the substrate at least partially coincides with both an orthographic projection of the first light emitting device on the substrate and an orthographic projection of the second light emitting device on the substrate, and an orthographic projection of the second light absorbing member on the substrate at least partially coincides with both the orthographic projection of the first light emitting device on the substrate and the orthographic projection of the second light emitting device on the substrate.

In some exemplary embodiments, the first light absorbing member and the second light absorbing member are stacked in a direction perpendicular to the substrate.

In some exemplary embodiments, a material of the first light absorbing member comprises: N,N'-BIS(1-HEXYL-HEPTYL)-PERYLENE-3,4:9,10-BIS(DICARBOXIM-IDE).

In some exemplary embodiments, a material of the second light absorbing member comprises: 4-(Dicyanomethylene)-2-tert-butyl-6-(1,1,7,7-tetramethyljulolidin-4-yl-vinyl)-4H-pyran.

In some exemplary embodiments, the pixel unit further comprises a TFE layer configured to encapsulate the first light emitting device, the second light emitting device and the third light emitting device, and the light absorbing layer is at a side of the TFE layer away from the first light emitting device, the second light emitting device and the third light emitting device.

In some exemplary embodiments, the first light emitting device, the second light emitting device and the third light emitting device comprise OLED devices.

In some exemplary embodiments, the first light emitting device comprises a first anode, a first light-emitting functional layer and a first cathode that are sequentially arranged in a direction away from the substrate, wherein the first light-emitting functional layer is configured to emit the light of the first color through the first cathode, the second light emitting device comprises a second anode, a second light-emitting functional layer and a second cathode that are sequentially arranged in a direction away from the substrate, wherein the second light-emitting functional layer is configured to emit the light of the second color through the second cathode, and the third light emitting device comprises a third anode, a third light-emitting functional layer and a third cathode that are sequentially arranged in a direction away from the substrate, wherein the third light-emitting functional layer is configured to emit the light of the third color through the third cathode.

In some exemplary embodiments, the pixel unit further comprises at least one of a protective cover layer and a cover plate, wherein the protective cover layer and the cover plate are at a side of the light absorbing layer away from the substrate.

In some exemplary embodiments, the pixel unit further comprises a fourth light emitting device, wherein the fourth light emitting device is configured to emit light of a fourth color, and luminance of the light of the fourth color is greater than luminance of the light of the third color, and wherein the light absorbing layer is further configured to absorb at least one of a portion of the light of the first color, a portion of the light of the second color and a portion of the light of the fourth color.

In some exemplary embodiments, the light of the fourth color comprises yellow light.

In some exemplary embodiments, the light absorbing layer comprises at least one of a first light absorbing member at a light exiting side of the first light emitting device, a second light absorbing member at a light exiting side of the second light emitting device and a third light absorbing member at a light exiting side of the fourth light emitting device, wherein the first light absorbing member is configured to absorb said portion of the light of the first color, the second light absorbing member is configured to absorb said portion of the light of the second color and the third light absorbing member is configured to absorb said portion of the light of the fourth color.

According to another exemplary embodiment, there is provided a display panel, comprising the pixel unit according to the embodiment of the present disclosure.

In some exemplary embodiments, the light absorbing layers of a plurality of the pixel units are connected to form a layer structure.

According to yet another exemplary embodiment, there is provided a display device, comprising the display panel according to the embodiment of the present disclosure.

BRIEF DESCRIPTION OF DRAWINGS

These and other aspects of the present disclosure are apparent from the following exemplary embodiments. The exemplary embodiments of the present disclosure will be further elucidated, by way of example, with reference to the drawings, in which corresponding reference symbols indicate corresponding parts, and in which.

DETAILED DESCRIPTION

Figure 1A:
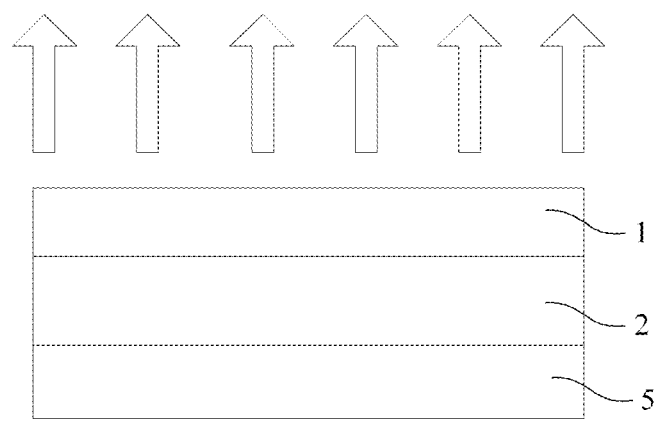
FIG. 1A schematically shows a partial structure of a pixel unit in accordance with an exemplary embodiment.

The technical solutions in embodiments of the present disclosure will be clearly and completely described below with reference to the accompanying drawings in the exemplary embodiments presented herein. It is obvious that the described embodiments are only a part of the embodiments of the present disclosure, and not all of the embodiments. All other embodiments obtained by a person of ordinary skill in the art based on the exemplary embodiments disclosed herein without paying creative effort are within the protection scope of the present disclosure.

It is to be noted that all terms (including technical and scientific terms) used in the exemplary embodiments, unless defined otherwise, have the same meaning as commonly understood by one of ordinary skill in the art. It should also be understood that terms such as those defined in the ordinary dictionary should be interpreted as having meanings consistent with their meanings in the context of the related art, and should not be interpreted in an idealized or extremely formalized meaning unless explicitly stated herein.

For example, the terms such as "first," "second," and other similar terms used in the specification and claims of the disclosure are not intended to mean any order, quantity, or priority, and are merely used to distinguish different components. The word "comprise" or "comprising" or the like means that the element or item preceding the word is intended to cover the elements or the items that are listed after the word and their equivalents, and do not exclude other elements or items. The terms indicating the orientation or positional relationships, such as "on/upper", "below/lower", and the like, are based on the orientation or positional relationship shown in the drawings. They are only simplified descriptions for the convenience of explaining the technical solutions of the present disclosure, and do not indicate or imply that the device or element they are referred to must have a particular orientation, be constructed and operated in a particular orientation, and therefore should not be construed as limit to the disclosure.

In addition, since the actual size of the OLED device and the like involved in the embodiments of the present disclosure is very small, the actual thicknesses of the film layers such as the light absorbing layer are also small. For the sake of clarity, the structural dimensions and/or the layer thicknesses in the drawings of the exemplary embodiments are exaggerated and do not represent the actual dimensions and/or ratios unless otherwise stated.

The principle of the creation of color deviation (or color shift) is as follows. Since the three spectral primary color lights of red, green and blue light (which are selected from the actual spectrum), are impossible to deploy all colors existing in nature, the International Commission on Illumination (CIE), in the 1931, theoretically assumed three primary colors that do not exist in nature, namely the theoretical three primary colors X, Y and Z, to form the CIE-1931XYZ color system. The primary color X can be understood as a red/purple color with saturation higher than spectral red. The primary color Y can be understood as a green color with saturation higher than spectral green with wavelength of 520 nm. The primary color Z can be understood a blue color with saturation higher than spectrum blue with wavelength of 477 nm. In the color matching experiment, the amounts of the theoretical three primary colors required to achieve a color matching with the color to be measured are called the tristimulus values, which are represented by X, Y, and Z, respectively. The calculation methods of the X, Y and Z of the color to be measured are:

$X = \int_{380}^{780} \bar{x}(\lambda)\Phi(\lambda)d\lambda;$ $Y = \int_{380}^{780} \bar{y}(\lambda)\Phi(\lambda)d\lambda;$ $Z = \int_{380}^{780} \bar{z}(\lambda)\Phi(\lambda)d\lambda;$ wherein the integration area is 380 nm~780 nm. $\bar{x}(\lambda)$, $\bar{y}(\lambda)$, $\bar{z}(\lambda)$ are the spectral tristimulus values. The spectral tristimulus values refer to the amount of three primary colors to match the equal-energy spectral colors. $\phi(\lambda)$ is the spectrums corresponding to the tristimulus values. Since a cavity is formed between the anode and the cathode of the OLED device and the length of the chamber (referred to as the cavity length) has a certain functional relationship with the wavelength of the light emitted by the device, the actual cavity length of the device changes under different viewing angles, such that the wavelength of the emitted light would be influenced, i.e., the interference of the microcavity effect exists when the OLED device emits light. Specifically, considering the direction perpendicular to the emitting surface of the OLED device a front viewing angle, and the direction forming an angle with the front view angle a side viewing angle, due to the microcavity effect, the degree of attenuation of the red, green or blue spectra $\phi(\lambda)$ emitted by the sub-pixels of the OLED device is different under different viewing angles, which causes the tristimulus values X, Y, and Z to change, and in turn causes the tristimulus values $X_w$, $Y_w$, and $Z_w$ of white light synthesized by the red, green, and blue light to change, such that the display screen shows color shift. For example, in some OLED devices, the blue light is more largely attenuated with a change in viewing angle, so that the display effect is yellowish; in some OLED devices, the red light is more largely attenuated with a change in viewing angle, so that the display effect is greenish. It should be understood that the term "degree of attenuation" does not only refer to a change in the attenuation value, but also includes a change in the attenuation ratio.

x, y, and z are the chromaticity coordinates of the CIE 1931 standard color system, and the calculation method is:

$x = X/(X+Y+Z);$ $y = Y/(X+Y+Z);$ $z = Z/(X+Y+Z);$

Due to the microcavity effect, the Luminance-Decay (L-Decay) curve, which shows the change of the degree of attenuation of the luminance of the light emitted by the OLED device with the viewing angle, no longer obeys the ideal model—the Lambert model. The trends of the L-Decay curves of red light, green light and blue light are no longer consistent, resulting in a shift of the chromaticity coordinates (x, y). For example, when the luminance of blue light is less than the luminance of red light and green light, the stimulus value Z decreases and the chromaticity coordinates (x, y) become larger when the display panel is displaying a screen, such that macroscopically, a white screen becomes yellowish. This phenomenon affects the display quality.

According to an exemplary embodiment, there is provided a pixel unit, which comprises a substrate, and a plurality of first light emitting device, second light emitting device and third light emitting device on the substrate. The first light emitting device emits light of the first color, the second light emitting device emits light of the second color, and the third light emitting device emits light of the third color. The degree of attenuation of the light of the first color caused by the microcavity effect produced by the microcavity of the first light emitting device and the degree of attenuation of the light of the second color caused by the microcavity effect produced by the microcavity of the second light emitting device are less than the degree of attenuation of the light of the third color caused by the microcavity effect produced by the microcavity of the third light emitting device. The pixel unit further comprises a light absorbing layer located at the light exiting side of the first light emitting device or the light exiting side of the second light emitting device. The light absorbing layer is configured to absorb at least one of a portion of the light of the first color and a portion of the light of the second color. The term in the form of "at least one of A and B" means only A, only B, or both A and B are contained. For example, the expression "at least one of the portion of the light of the first color and the portion of the light of the second color" includes three embodiments, namely only the portion of the light of the first color, only the portion of the light of the second color, and both the part of the light of the first color and the part of the light of the second color.

In some exemplary embodiments, the first light emitting device, the second light emitting device, and the third light emitting device may be OLED devices. In some parts of the following description, the exemplary embodiments will be describes with the OLED devices being examples.

It should be noted that the above mentioned substrate may be an array substrate on which a thin film transistor array layer is formed. The array substrate comprises a base substrate and thin film transistor(s) formed on the base substrate. The thin film transistor is configured to control electroluminescence of the OLED device.

FIG. 1A schematically shows a partial structure of a pixel unit in accordance with an embodiment of the present disclosure. The arrows in FIG. 1A schematically shows the light exiting direction of the OLED device 2. The light absorbing layer 1 is at the side of the OLED device 2 where the light exits, that is, the side of the OLED device 2 away from the substrate 5.

In some exemplary embodiments, the light absorbing layer 1 comprises at least one of the first light absorbing member 101 at the light exiting side of the first OLED device 201 and the second light absorbing member 102 at the light exiting side of the second OLED device 202. That is, the light absorbing layer 1 may include only the first light absorbing member 101, or only the second light absorbing member 102, or both the first light absorbing member 101 and the second light absorbing member 102.

Figure 1B:
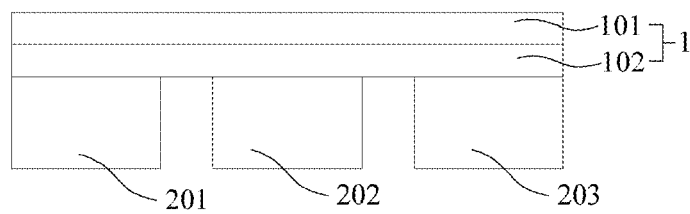
FIG. 1B schematically shows an exemplary embodiment of the partial structure of FIG. 1A.

FIG. 1B schematically illustrates an embodiment of the partial structure of FIG. 1A. In this exemplary embodiment, the orthographic projection of the first light absorbing member 101 on the substrate at least partially coincides with both the orthographic projection of the first light emitting device 201 on the substrate and the orthographic projection of the second light emitting device 202 on the substrate. The orthographic projection of the second light absorbing member 102 on the substrate at least partially coincides with both the orthographic projection of the first light emitting device 201 on the substrate and the orthographic projection of the second light emitting device 202 on the substrate. In other words, the light absorbing layer 1 is an integrated layer structure covering the first light emitting device 201, the second light emitting device 202, and the third light emitting device 203. The first light absorbing member 101 and the second light absorbing layer 102 both cover the first light emitting device 201, the second light emitting device 202, and the third light emitting device 203. It should be understood that in the above embodiment, the first light absorbing member 101 and the second light absorbing member 102 are both layer structures, that is, the light absorbing layer 1 includes two sub-layers. However, in other exemplary embodiments, the material of the first light absorbing member and material of the second light absorbing member may be mixed to form an integrate light absorbing layer 1, that is, the light absorbing layer 1 is a single layer structure.

Figure 1C:
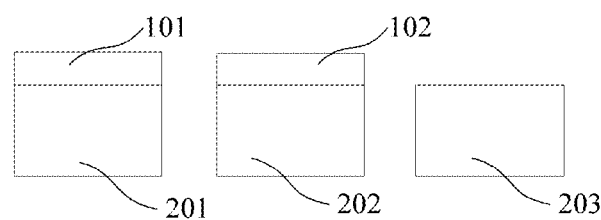
FIG. 1C schematically shows another exemplary embodiment of the partial structure of FIG. 1A.

FIG. 1C schematically illustrates another exemplary embodiment of the partial structure of FIG. 1A. In this exemplary embodiment, the orthographic projection of the first light absorbing member 101 on the substrate at least partially coincides only with the orthographic projection of the first light emitting device 201 on the substrate. The orthographic projection of the second light absorbing member 102 on the substrate at least partially coincides only with the orthographic projection of the second light emitting device 202 on the substrate. In other words, the first light absorbing member 101 covers only the first light emitting device 201, and the second light absorbing member 102 covers only the second light emitting device 202. In a specific exemplary embodiment, with respect to the substrate, the first light absorbing member 101 and the second light absorbing member 102 are in the same layer, that is, the distance between the first light absorbing member 101 and the substrate is equal to the distance between the second light absorbing member 102 and the substance.

Here, the material of the light absorbing layer has the ability to absorb spectrum in a specific band. The material for forming the light absorbing layer can be correspondingly selected according to the specific band of light of the first color and/or light of the second color that are to be absorbed. Although the above description describes an exemplary embodiment in which the light absorbing layer 1 is physically divided into the first light absorbing member 101 and the second light absorbing member 102, it should be understood that this is not essential. Specifically, the material of the light absorbing layer 1 can be configured to absorb both the light of the first color and the light of the second color. By partially absorbing the light with stronger luminance, the tristimulus values X, Y, and Z of the screen of the display panel are balanced, thereby optimizing the color shift phenomenon of the OLED panel.

It should be understood that the expression "the light absorbing layer is configured to absorb at least one of a portion of the light of the first color and a portion of the light of the second color" may comprises different exemplary embodiments, which include, but are not limited to, that the light absorbing layer can absorb the light of the first color and the light of the second color but does not absorb the light of the third color, and the light absorbing layer can absorb the light of the first color, the light of the second color, and the light of the third color and degree of absorption of the light of the first color and the light of the second color is greater than that of the light of the third color.

Figure 2:
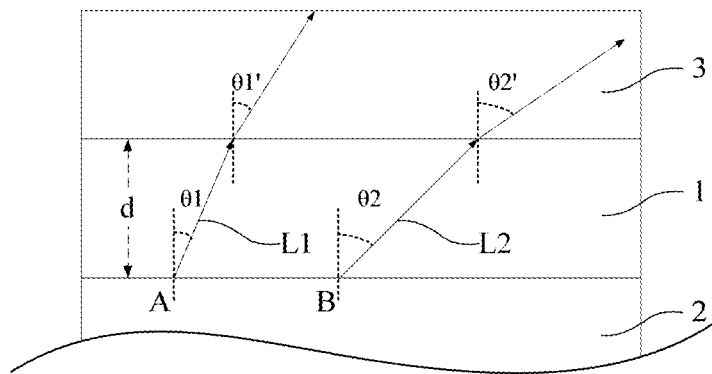
FIG. 2 schematically shows a comparison of optical paths of light at different angles of incidence inside the light absorbing layer of an exemplary embodiment.

FIG. 2 schematically shows a comparison of the optical paths of light with different incident angle in the light absorbing layer. As shown in FIG. 2, light emitted from the OLED device 2 is incident into the light absorbing layer 1 at different angles, and is emitted through the protective layer 3 overlying the light absorbing layer 1. Depending on the incident angles θ, the light emitted by the OLED device 2 will have different paths L in the light absorbing layer 1. When the incident angle increases from θ1 to θ2, that is, when the viewing angle of human eye increases, the path of the incident light inside the light absorbing layer 1 is changed from L1 to L2. Since the material of the light absorbing layer 1 absorbs the incident light, the attenuation of the incident light becomes larger as the physical length of the path of the incident light inside the light absorbing layer 1 becomes longer. Therefore, the L-Decay curve of the incident light can be adjusted by adjusting parameters such as the material and thickness of the light absorbing layer 1.

For example, when the degree of attenuation of the blue light emitted by the blue sub-pixel caused by the microcavity effect is greater than the degree of attenuation of the red light emitted by the red sub-pixel caused by the microcavity effect and the degree of attenuation of the green light emitted by the green sub-pixel caused by the microcavity effect, the white screen displayed on the display panel is yellowish. In this case, the light emitted by at least one of the red light emitting sub-pixel and the green light emitting sub-pixel can be partially absorbed by applying the above-described light absorbing layer 1. By partially absorbing the red and/or green light, whose attenuation is less, the tristimulus values X, Y, and Z of the displayed screen of the display panel can be balanced, thereby improving the color shift phenomenon of the OLED panel. It should be understood that in one pixel, it is both possible that the degree of attenuation of red light is larger and the degree of attenuation of green light is larger. This application also applies to these situations.

Based on the above, the pixel unit according to the embodiment of the present disclosure, by providing a light absorbing layer on the light exiting side of the OLED device, partially absorbs the light with stronger luminance, such that the tristimulus values X, Y, and Z of the displayed screen of the display panel can be balanced, thereby improving the color shift phenomenon of the OLED panel.

In some exemplary embodiments, a light emitting device can comprise layer structures, specifically an anode, a cathode, and a light-emitting functional layer sandwiched between the anode and the cathode. Specifically, in the first light emitting device, a first anode, a first light-emitting functional layer and a first cathode are arranged sequentially away from the substrate. The light of the first color emitted by the first light-emitting functional layer exits through the first cathode. In the second light emitting device, a second anode, a second light-emitting functional layer and a second cathode are arranged sequentially away from the substrate. The light of the second color emitted by the second light-emitting functional layer is emitted through the second cathode. In the third light emitting device, a third anode, a third light-emitting functional layer, and a third cathode are arranged sequentially away from the substrate. The light of the third color emitted by the third light-emitting functional layer is emitted through the third cathode.

The anode of the light emitting device is electrically connected to the drain of the thin film transistor in the array structure layer of the array substrate to receive a corresponding electrical signal. The cathodes receive the same common signal, so that the first cathode, the second cathode and the third cathode of the respective light emitting devices emitting lights of different colors can be connected together to form a whole layer of common cathode and receive the same common signal. The light-emitting functional layer may further include specific structures such as an Electron Transport Layer, an Organic Emission Layer, and a Hole Transport Layer, etc.

Figure 3:
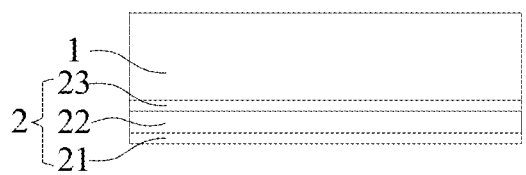
FIG. 3 schematically shows a specific layer structure of the partial structure of FIG. 1A.

FIG. 3 schematically shows specific layer structures of the partial structure of FIG. 1A. As shown in FIG. 3, in some exemplary embodiments, the light emitting device 2 can be a top emitting OLED device. In the top emitting OLED device, a part of the light emitted from the light-emitting functional layer 22 directly passes through the cathode 23, and the other part passes through the cathode 23 after being reflected by the anode 21. These two parts of light can form constructive interference. When the viewing angles are different, the optical path differences of the two parts of light are different, so that the degree of constructive interference is different, i.e., the degree of attenuation is different. In the viewing angle of FIG. 3, the light absorbing layer 1 is located above the cathode 23 of the OLED device 2. The specific arrangement comprises, but not limited to, directly arranging the light absorbing layer 1 on the surface of the cathode 23, as shown in FIG. 3. The light absorbing layer 1 is only required to be above the cathode 23. For example, other layer structures such as a transparent protective layer may be installed therebetween.

When the OLED device 2 is a top emitting device, the anode 21 under the light-emitting functional layer is a total reflective structure, and specifically may comprises a laminated structure of transparent ITO (Indium Tin Oxide) and metal elemental Ag (silver). The cathode may comprise metal element or alloy having a small thickness and a high light transmittance. The specific arrangement of materials may refer to the common technique and will not be limited in the present disclosure.

Since the cathode usually comprises a chemically active metal, it may undergo electrochemical corrosion, especially in a water-oxygen environment, resulting in device failure. The light-emitting functional layer is easily oxidized by oxygen to form a carbonyl compound. A carbonyl compound is a compound that acts as a quenching agent, which reduces the luminescence quantum efficiency of OLED devices. Therefore, OLED devices need to be packaged to block water and oxygen attack from the environment.

Figure 4:
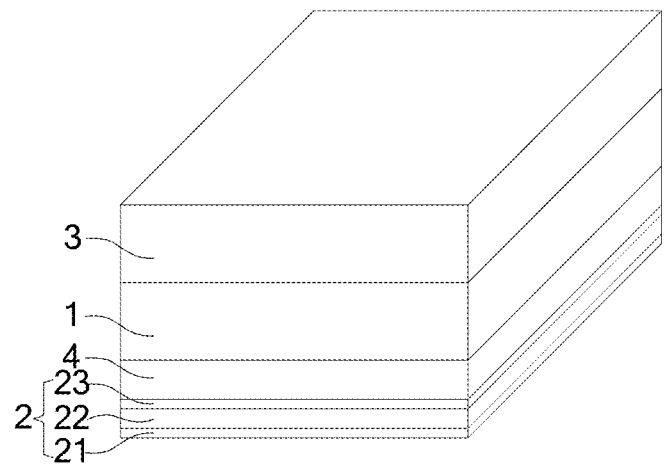
FIG. 4 schematically shows another partial structure of a pixel unit in accordance with an exemplary embodiment.

FIG. 4 schematically shows another partial structure of a pixel unit in accordance with an exemplary embodiment. As shown in FIG. 4, the pixel unit further comprises a TFE Layer (Thin Film Encapsulation Layer) 4 configured to encapsulate the first OLED device, the second OLED device and the third OLED device. The light absorbing layer 1 is located on the side of the TFE Layer 4 away from the OLED device to avoid the influence to the OLED device by the process of forming the light absorbing layer 1.

Further, the pixel unit may further comprise a protective layer 3 on the side of the light absorbing layer 1 away from the substrate. The protective layer 3 may be a protective cover layer or a cover plate (for example, a cover glass), or may be a laminated structure of the protective cover layer and the cover plate. The specific arrangement of the layers may refer to the common technique and will not be limited in the present disclosure.

In some exemplary embodiments, the material of the light absorbing layer 1 that absorbs red light may be: [N,N'-BIS(1-HEXYLHEPTYL)-PERYLENE-3,4:9,10-BIS-(DICARBOXIMIDE)] whose structure is as follows:

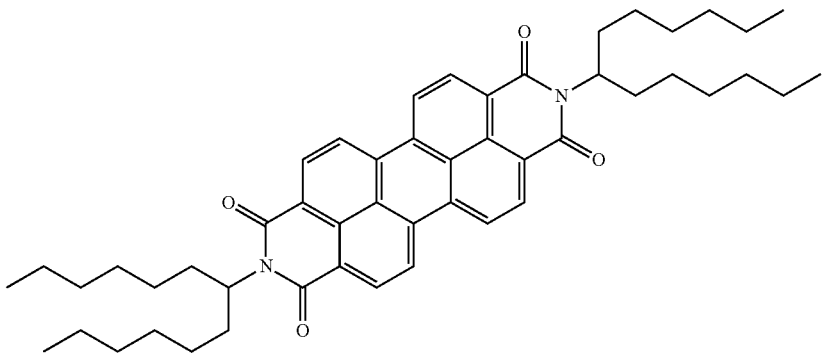

The material of the light absorbing layer 1 that absorbs green light can be: [4-(Dicyanomethylene)-2-tert-butyl-6-(1,1,7,7-tetramethyljulolidin-4-yl-vinyl)-4H-pyran] whose structure is as follows:

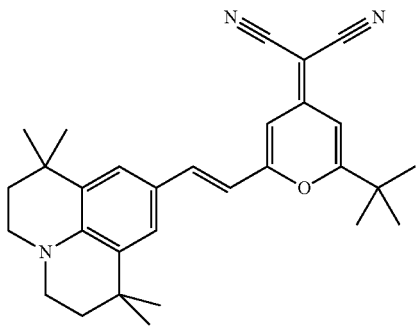

The material of the light absorbing layer 1 that absorbs blue light can be: [10-(2-Benzothiazolyl)-2,3,6,7-tetrahydro-1,1,7,7-tetramethyl-1H,5H,11H-(1)benzopyropyrano(6,7-8-I,j)quinolizin-11-one] whose structure is as follows:

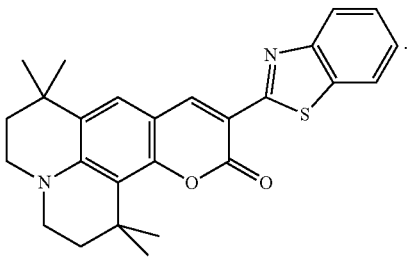 [SMILES: CC1(C)CCN2CCC(C)(C)c3c2c1cc1cc(-c2nc4ccccc4s2)c(=O)oc31]

At present, in an OLED pixel unit, the degree of reduction in the luminance (i.e., degree of attenuation) of the blue light due to an increasing viewing angle is larger than the degree of reduction in the luminance of the red light and the green light. Thus, in some exemplary embodiments, the light of the first color is red light, the light of the second color is green light, and the light of the third color is blue light.

As described above, in some e exemplary embodiments, the light absorbing layer 1 specifically comprise at least one of a first light absorbing member covering only first OLED device (which is used to absorb a portion the light of the first color (i.e., the red light) emitted by the first OLED device) and a second light absorbing member covering only the second OLED device (which is used to absorb a portion of the light of the second color (i.e., the green light) emitted by the second OLED device). The light exiting side of the third OLED device that emits blue light is not provided with the light absorbing layer so that the influence to the transmittance of the blue light being avoided.

The material of the first light absorbing member may be the above mentioned N,N'-BIS(1-HEXYLHEPTYL)-PERYLENE-3,4:9,10-BIS-(DICARBOXIMIDE), or the material and thickness of the first light absorbing member may be selected according to the degree of color shift of the red light.

The material of the second light absorbing member may be the above mentioned 4-(Dicyanomethylene)-2-tert-butyl-6-(1,1,7,7-tetramethyljulolidin-4-yl-vinyl)-4H-pyran, or the material and thickness of the second light absorbing member may be selected according to the degree of color shift of the green light.

Referring to the principle of optical paths shown in FIG. 2, the relationship between the thickness d of the light absorbing layer 1, the physical length L of the path of the incident light inside the light absorbing layer 1, and the angle of refraction θ of the incident light entering into the light absorbing layer 1 through the interface between the OLED device 2 and the light absorbing layer 1 follows the following equation:

$$L = d/\cos\theta \quad \text{(Equation 1-1)}$$

According to the Beer-Lambert law, the relationship between the transmittance T of the light and the path length L of the light inside the light absorbing layer follows the following equation:

$$lg(1/T) = k \cdot c \cdot L \quad \text{(Equation 1-2)}$$

wherein k is the molar absorption coefficient and c is the molar concentration (mol/L) of the light absorbing substance. Both k and c are related to the nature of the material of the light absorbing layer and are independent from the angle of incidence. Therefore, the following relationship can be derived from Equation 1-1 and Equation 1-2:

$$lg(1/T) = k \cdot c \cdot L = k \cdot c \cdot d/\cos\theta = K \cdot d/\cos\theta \quad \text{(Equation 1-3)}$$

wherein K is the product of k and c.

The relationship between the transmittance T and the angle θ of the light inside the light absorbing layer can be obtained according to the above Equation 1-3:

$$T = 10^{-\frac{K \cdot d}{\cos\theta}} \quad \text{(Equation 1-4)}$$

In the situation that the light absorbing layer 1 specifically comprises the first light absorbing member which absorbs the light of the first color (i.e., red light) and the second light absorbing member which absorbs of the light of the second color (i.e., green light), and the K·d product of the first light absorbing member is specifically selected as 0.15, and the K·d product of the second light absorbing member is specifically selected as 0.11, the red light transmittance $T_R$ and the green light transmittance $T_G$ under different angles θ inside the corresponding light absorbing layer is shown in Table 1.1 below.

TABLE 1.1

| θ/° | $T_R$/% – K · $d_R$ = 0.15 | $T_G$/% – K · $d_G$ = 0.11 |
|---|---|---|
| 0 | 0.7079 | 0.7762 |
| 10 | 0.7042 | 0.7732 |
| 20 | 0.6924 | 0.7637 |
| 30 | 0.6711 | 0.7464 |
| 40 | 0.6136 | 0.6989 |
| 50 | 0.5843 | 0.6743 |
| 60 | 0.5012 | 0.6026 |
| 70 | 0.3643 | 0.4768 |

Figure 5:
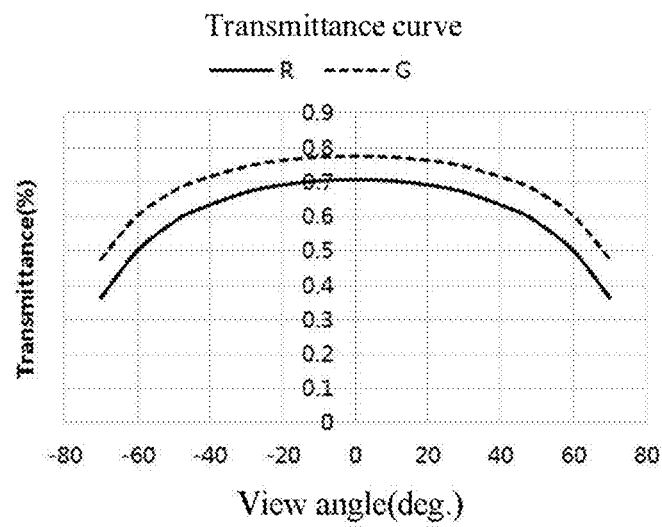
FIG. 5 schematically shows a curve representing the relationship between the transmittance T and the angle θ of light inside the light absorbing layer under different viewing angles of an exemplary embodiment.

FIG. 5 shows the curve with respect to the transmittance T and the angle θ of the red light in the first light absorbing member and the green light in the second light absorbing member obtained from the Table 1.1. In FIG. 5, the abscissa "View angel (deg.)" represents the viewing angles and the ordinate "Transmittance (%)" represents the transmittances T.

It can be seen that for the first light absorbing member and the second light absorbing member, when the material parameter K and the thickness d are determined, as the absolute value of the angle θ increases, the physical path of the red light in the first light absorbing member becomes longer, the light attenuation increases and the transmittance T gradually decreases; the physical path of the green light in the second light absorbing member becomes longer, the light attenuation increases and the transmittance T gradually decreases. Since the first light absorbing member and the second light absorbing member described above are structures independently disposed on the first OLED device and the second OLED device as shown in FIG. 1C, the thickness d and the absorbance (i.e., the parameter K) can be adjusted to improve color shift.

The color shift of the display panel without light absorbing layer in the related art and the color shift of the display panel with the light absorbing layer of the embodiment of the present disclosure will be compared below. In this exemplary embodiment, the first light absorbing member that absorbs part of the red light is disposed on the surface of the red sub-pixel (i.e., the first OLED device), where K·$d_R$=0.15. A second light absorbing member that absorbs part of the green light is disposed on a surface of the green sub-pixel (i.e., the second OLED device), wherein $K \cdot d_G = 0.11$.

Table 1.2 shows the luminance and chromaticity coordinates (x, y) of the red, blue, and green light emitting devices at different viewing angles of a display panel without an absorbing layer in the related art, and luminance and chromaticity coordinates (x, y) of white light emitted by the display panel and the degree of shift of white light. Lum indicates luminance, and JNCD (Just Noticeable Color Difference) is a unit that reflects the degree of color shift.

TABLE 1.2

| | R | | | G | | | B | | |
|---|---|---|---|---|---|---|---|---|---|
| deg. | Lum. | x | y | Lum. | x | y | Lum. | x | y |
| 0 | 94.1 | 0.6668 | 0.3330 | 233.5 | 0.2339 | 0.7106 | 22.4 | 0.1419 | 0.0433 |
| 10 | 95.0 | 0.6657 | 0.3340 | 228.3 | 0.2274 | 0.7133 | 21.1 | 0.1426 | 0.0423 |
| 20 | 95.8 | 0.6633 | 0.3364 | 210.9 | 0.2107 | 0.7179 | 17.8 | 0.1440 | 0.0404 |
| 30 | 92.9 | 0.6575 | 0.3422 | 177.4 | 0.1919 | 0.7153 | 13.5 | 0.1455 | 0.0391 |
| 40 | 68.3 | 0.6415 | 0.3581 | 112.5 | 0.1811 | 0.6967 | 7.9 | 0.1450 | 0.0424 |
| 50 | 57.3 | 0.6383 | 0.3613 | 95.1 | 0.1805 | 0.6934 | 6.7 | 0.1442 | 0.0441 |
| 60 | 40.2 | 0.6366 | 0.3630 | 67.8 | 0.1836 | 0.6844 | 4.9 | 0.1440 | 0.0449 |
| 70 | 27.9 | 0.6323 | 0.3671 | 39.7 | 0.1948 | 0.6750 | 2.7 | 0.1444 | 0.0464 |

| | W | | | |
|---|---|---|---|---|
| deg. | Lum. | x | y | Color shift degree-JNCD |
| 0 | 350.0 | 0.3000 | 0.3100 | 0.0 |
| 10 | 344.3 | 0.3021 | 0.3123 | 0.4 |
| 20 | 324.5 | 0.3082 | 0.3182 | 1.6 |
| 30 | 283.8 | 0.3197 | 0.3284 | 3.7 |
| 40 | 188.6 | 0.3319 | 0.3509 | 6.8 |
| 50 | 159.1 | 0.3302 | 0.3550 | 7.1 |
| 60 | 112.9 | 0.3278 | 0.3549 | 7.0 |
| 70 | 70.9 | 0.3519 | 0.3641 | 9.7 |

Figure 6:
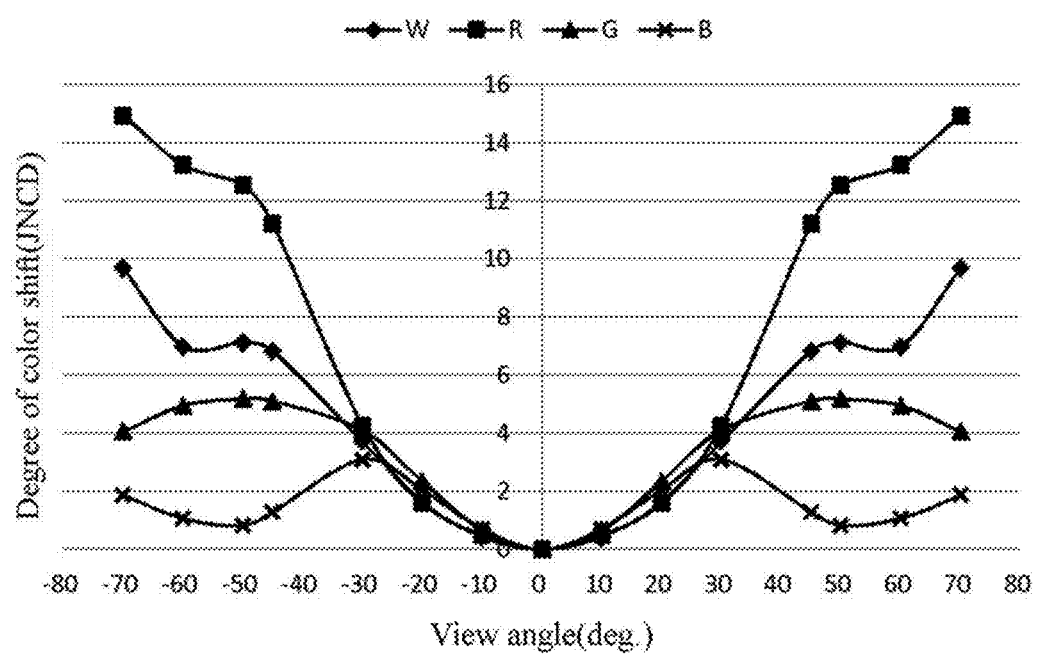
FIG. 6 schematically shows the shift curves of the color light of a pixel unit of the related art and the shift curve of the white light of the pixel unit of the related art with chromaticity coordinates being modulated to (0.30, 0.31)
Figure 7:
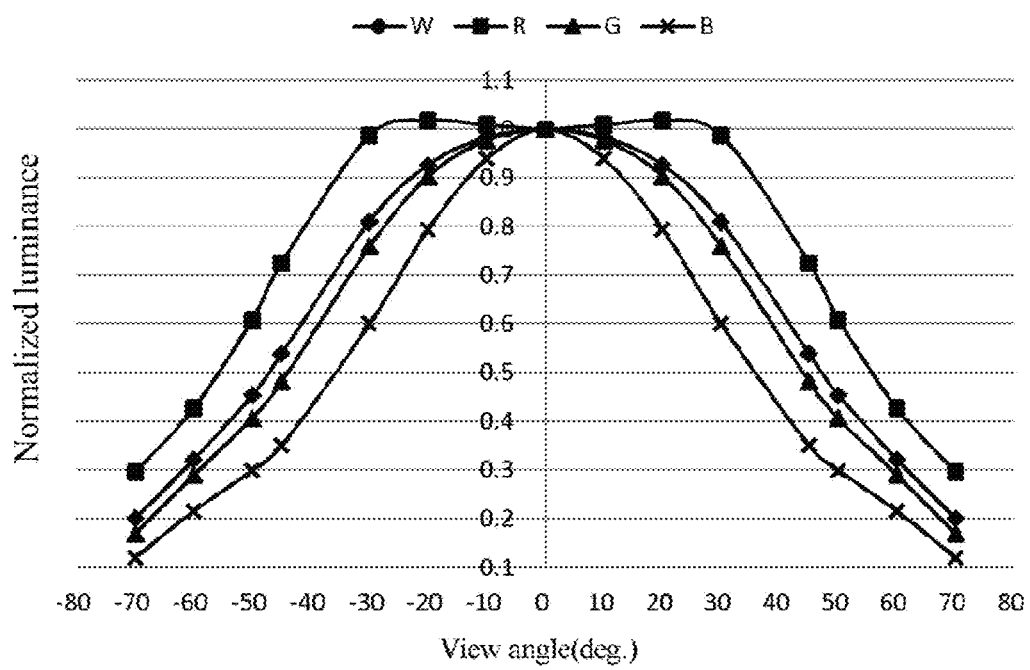
FIG. 7 schematically shows a luminance-attenuation curve of a pixel unit of the related art.
Figure 8:
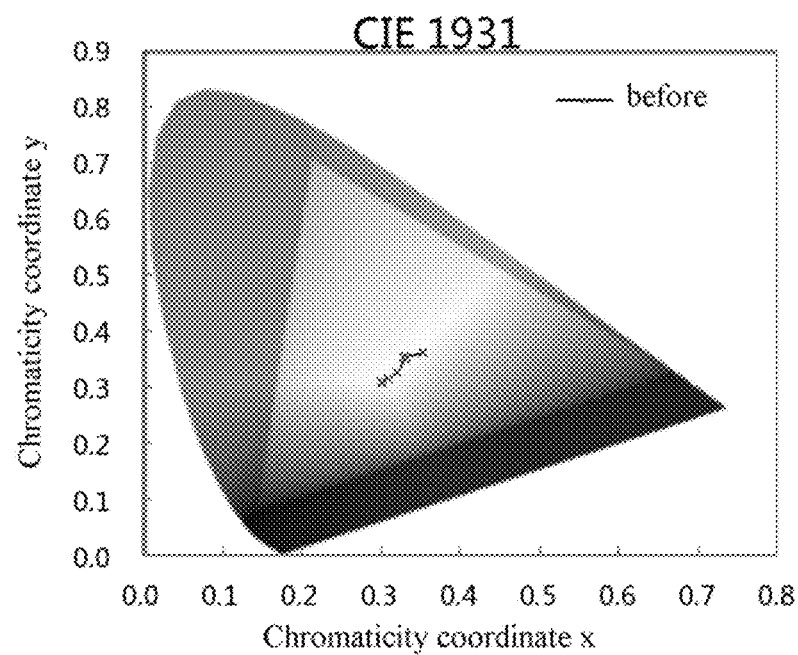
FIG. 8 schematically shows the variation of white light chromaticity coordinates, as a function of viewing angle, of the pixel unit according to the related art, represented in the CIE 1931 chromaticity space.
Figure 9:
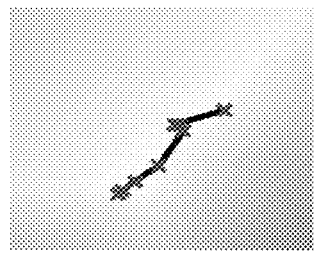
FIG. 9 schematically shows an enlarged view of the curve of the shift of the white light chromaticity coordinate in FIG. 8.

FIG. 6 is an color shift curve of each color of a pixel unit of the related art obtained from Table 1.2, and shift curve of white light chromaticity coordinates modulated to (0.30, 0.31). FIG. 7 is a luminance-attenuation curve (L-Decay Curve) of a pixel unit according to the related art obtained from Table 1.2. FIG. 8 shows the variation of white light chromaticity coordinates, as a function of viewing angle, of the pixel unit according to the related art obtained from Table 1.2, represented in the CIE 1931 chromaticity space. FIG. 9 is an enlarged view of a part of FIG. 8.

It can be seen from FIG. 6 that as the absolute value of the viewing angle increases, red light (R), green light (G), blue light (B), and white light (W) exhibit an overall shift. It can be seen from FIG. 7 that as the absolute value of the viewing angle increases, the L-Decay curves no longer obeys the Lambert body under the influence of the microcavity effect of the OLED device, and trends of the L-Decay curves of the R, G, and B colors are not the same, resulting a shift of the chromaticity coordinates (x, y). It can be seen from FIG. 8 and its partially enlarged diagram FIG. 9, that as the viewing angle increases, W is severely yellowish, and the white light chromaticity coordinates are shifted. The points on the shift curve in the figure indicate the change of white light chromaticity coordinates as a function of the viewing angle. The chromaticity coordinates shift from a standard coordinate (0.30, 0.31) under the 0° viewing angle to (0.35, 0.36), the degree of color shift is close to 10 JNCD, which seriously affects the user's perception. The reason for the color shift is that the absorption of blue light is greater than the red light and green light. In the white light chromaticity coordinates, the values of $X_w$ and $Y_w$ are much larger than $Z_w$, resulting in a yellowish white screen, which affects the display quality.

For this reason, the degree of shift of the W light to yellow can be modified by reducing the luminance of R and G light, thereby improving the color shift of the displayed white screen.

Table 1.3 is simulation results of the luminance and chromaticity coordinates (x, y) of the red, green, and blue light emitting device at different viewing angles and the luminance and chromaticity coordinates (x, y) of white light and the degree of shift of white light in the pixel unit having corresponding light absorbing layer on the light exiting side of the red and green OLED devices, in accordance with the exemplary embodiment, based on the foregoing Table 1.1.

TABLE 1.3

| | R | | | G | | | B | | |
|---|---|---|---|---|---|---|---|---|---|
| deg. | Lum. | x | y | Lum. | x | y | Lum. | x | y |
| 0 | 94.1 | 0.6668 | 0.3330 | 233.5 | 0.2339 | 0.7106 | 22.4 | 0.1419 | 0.0433 |
| 10 | 94.5 | 0.6657 | 0.3340 | 227.4 | 0.2274 | 0.7133 | 21.1 | 0.1426 | 0.0423 |
| 20 | 93.7 | 0.6633 | 0.3364 | 207.5 | 0.2107 | 0.7179 | 17.8 | 0.1440 | 0.0404 |
| 30 | 88.1 | 0.6575 | 0.3422 | 170.6 | 0.1919 | 0.7153 | 13.5 | 0.1455 | 0.0391 |
| 40 | 59.2 | 0.6415 | 0.3581 | 101.3 | 0.1811 | 0.6967 | 7.9 | 0.1450 | 0.0424 |
| 50 | 47.3 | 0.6383 | 0.3613 | 82.6 | 0.1805 | 0.6934 | 6.7 | 0.1442 | 0.0441 |

TABLE 1.3-continued

| deg. | Lum. | x | y | | | | | |
|---|---|---|---|---|---|---|---|---|
| 60 | 28.5 | 0.6366 | 0.3630 | 52.7 | 0.1836 | 0.6844 | 4.9 | 0.1440 | 0.0449 |
| 70 | 14.4 | 0.6323 | 0.3671 | 24.4 | 0.1948 | 0.6750 | 2.7 | 0.1444 | 0.0464 |

| | W | | | |
|---|---|---|---|---|
| deg. | Lum. | x | y | Deltau'v'-JNCD |
| 0 | 350.0 | 0.3000 | 0.3100 | 0.0 |
| 10 | 342.9 | 0.03017 | 0.0 | 0.4 |
| 20 | 319.0 | 0.0 | 0.0 | 1.3 |
| 30 | 272.1 | 0.0 | 0.0 | 2.9 |
| 40 | 168.3 | 0.0 | 0.0 | 4.8 |
| 50 | 136.6 | 0.0 | 0.0 | 4.6 |
| 60 | 86.0 | 0.0 | 0.0 | 2.6 |
| 70 | 41.5 | 0.0 | 0.0 | 0.2 |

Figure 10:
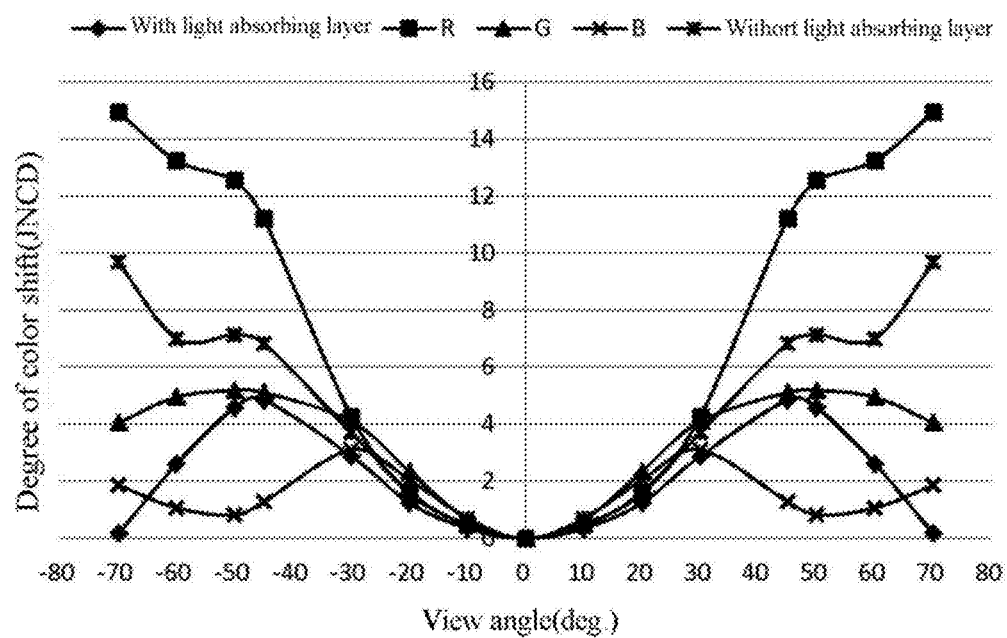
FIG. 10 schematically shows a simulated shift curve of the colors of the pixel unit according to an exemplary embodiment and a shift curve of white light with chromaticity coordinates being modulated to (0.30, 0.31).
Figure 11:
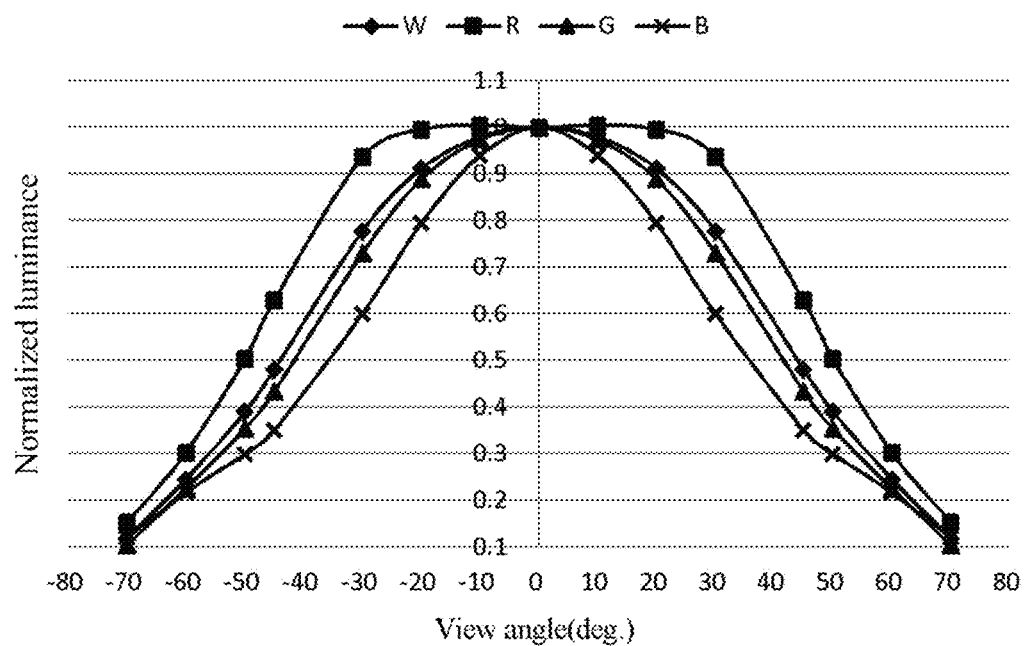
FIG. 11 schematically shows a simulated luminance-attenuation curve of the pixel unit according to an exemplary embodiment.
Figure 12:
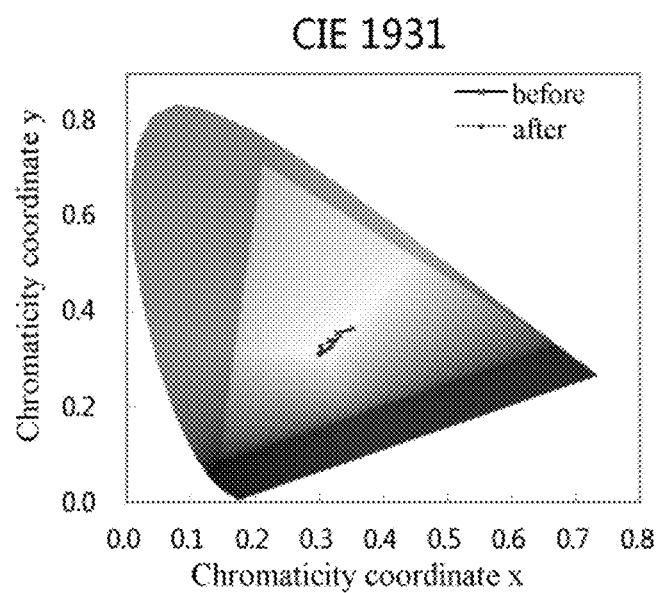
FIG. 12 schematically shows the variation of white light chromaticity coordinates, as a function of viewing angles, of the pixel unit according to an exemplary embodiment, represented in the CIE 1931 chromaticity space.
Figure 13:
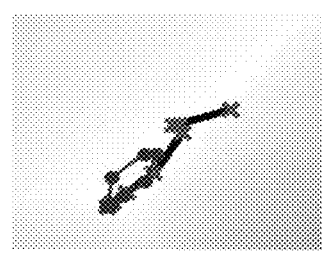
FIG. 13 schematically shows an enlarged view of the curve of the shift of white light chromaticity coordinate in FIG. 12.

FIG. 10 shows a shift curve of each color of a pixel unit according to an exemplary embodiment and a shift curve of white light chromaticity coordinates modulated to (0.30, 0.31) according to an exemplary embodiment. FIG. 11 shows a luminance-attenuation simulation curve (L-Decay Curve) of a pixel unit according to an embodiment of the present disclosure obtained according to Table 1.3. FIG. 12 shows the variation of the white light chromaticity coordinates of the pixel unit according to the exemplary embodiment as a function of viewing angles obtained from Table 1.3, represented in the CIE 1931 chromaticity space. FIG. 13 is a partially enlarged view of FIG. 12.

It can be seen from FIG. 10 and FIG. 11 that, by partially absorbing the red and green light by the corresponding light absorbing layer, the trend of the L-Decay curves of red, green and blue light are more consistent, so that the shifted chromaticity coordinates (x, y), which is a function of the viewing angle, is shifted back to the standard coordinates (0.30, 0.31).

Further, as can be seen from FIG. 12 and its partially enlarged view FIG. 13, as the viewing angle increases, the color shift of white color is significantly reduced, and the color shift at the large viewing angle is remarkably lowered. The maximum color shift appears at a 45° viewing angle, and the color shift is only 4.8 JNCD, which is not easy to be perceived by the user.

In addition to exemplary embodiments in which the first light emitting device, the second light emitting device, and the third light emitting device respectively emit red, green, and blue light, the present disclosure also provides exemplary embodiments in which pixel unit comprises white, red, green, and blue (WRGB) sub-pixels, or pixel unit comprises yellow, red, green, blue (YRGB) sub-pixels.

For a WRGB OLED device, the light emitting layer of the W sub-pixel directly emits white light, so there is no color shift problem, and its light exiting side does not have a light absorbing layer.

For a YRGB OLED device, the yellow light emitted by the Y sub-pixel is essentially a mixture of red and green light. Since the red and green light in the Y sub-pixel also has a problem of inconsistent with the blue light attenuation trend, an absorption layer can also be used to partially absorb the light of the yellow OLED device, thereby further balancing the tristimulus values X, Y, and Z.

Figure 14:
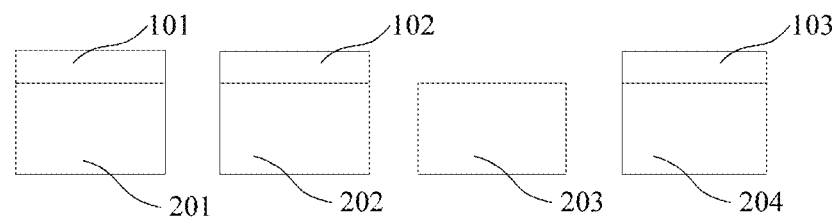
FIG. 14 schematically shows yet another partial structure of a pixel unit in accordance with an exemplary embodiment.

FIG. 14 shows another partial structure of the pixel unit in accordance with an exemplary embodiment. Specifically, the pixel unit further comprises a fourth OLED device 204. The fourth OLED device 204 emits light of a fourth color. The luminance of the light of the fourth color is also greater than the luminance of the light of the third color (i.e., blue light) emitted by the third OLED device. The light of the fourth color may specifically be yellow light. In this case, the light absorbing layer 1 described above also comprises a third light absorbing member 103 located on the side of the fourth OLED device 204 away from the substrate for absorbing a portion of the light of the fourth color emitted by the fourth OLED device 204. Although the exemplary embodiment of FIG. 14 shows a structure in which the respective light absorbing members are separately provided, the present disclosure also includes a structure in which the respective light absorbing members are stacked, and a single layer structure formed by mixing materials of each light absorbing member.

Since the light of the fourth color (i.e., the yellow light) emitted by the fourth OLED device is substantially a mixture of red light and green light, the material of the third light absorbing member 103 may be a combination the aforementioned red light absorbing material and green light absorbing material mixed according to a certain ratio or formed by stacking the two layers of the two materials.

In addition, according to another exemplary embodiment, there is further provided a display panel comprising the pixel unit according to an embodiment of the present disclosure. In some exemplary embodiments, the light absorbing layers of the pixel units can be connected to form an integrate layer structure. In addition, the substrates of the pixel units can also be connected.

In addition, according to yet another exemplary embodiment, there is further provided a display device, comprising the display panel according to the embodiment of the present disclosure. The display device may be an OLED display device, which may be any product or component having display function, such as an OLED display, an OLED TV, a tablet computer, a mobile phone, a digital photo frame, and a navigator.

To sum up, exemplary embodiments provide a pixel unit, comprising a substrate; a first light emitting device, a second light emitting device and a third light emitting device on the substrate, wherein the first light emitting device is configured to emit light of a first color, the second light emitting device is configured to emit light of a second color, the third light emitting device is configured to emit light of a third color, and a degree of attenuation of the light of the first color caused by a microcavity effect of the first light emitting device and a degree of attenuation of the light of the second color caused by a microcavity effect of the second light emitting device are smaller than a degree of attenuation of the light of the third color caused by a microcavity effect of the third light emitting device; and a light absorbing layer at a light exiting side of the first light emitting device or a light exiting side of the second light emitting device, wherein the light absorbing layer is configured to absorb at least one of a portion of the light of the first color and a portion of the light of the second color.

The pixel unit, the display panel, and the display device provided by the exemplary embodiments partially absorb the light of higher luminance, thereby balancing the tristimulus values X, Y, and Z of the displayed screen of the display panel, thereby modifying the color shift phenomenon of the OLED panel. Specifically, in the display panel provided by the exemplary embodiment, by adding an additional light absorbing layer on the light exiting side of the OLED device, the light emitted by the OLED device with higher luminance is partially absorbed, thereby the tristimulus values X, Y, and Z of the displayed screen of the display panel is balanced, thereby modifying the color shift phenomenon of the OLED panel.

The above are only specific exemplary embodiments, but the protection scope of the present disclosure is not limited thereto. Changes or substitutions that can be easily conceived by the person skilled in the art within the technical field of the present disclosure should be in the protection scope of the present disclosure. Therefore, the protection scope of the present disclosure should be determined by the scope of the claims.

I claim:

1. A pixel unit, comprising:
   a substrate,
   a first light emitting device, a second light emitting device and a third light emitting device on the substrate, wherein
   the first light emitting device is configured to emit light of a first color, the second light emitting device is configured to emit light of a second color, the third light emitting device is configured to emit light of a third color, the light of the first color comprises red light, the light of the second color comprises green light, and the light of the third color comprises blue light, and
   a degree of attenuation of the light of the first color caused by a microcavity effect of the first light emitting device and a degree of attenuation of the light of the second color caused by a microcavity effect of the second light emitting device are smaller than a degree of attenuation of the light of the third color caused by a microcavity effect of the third light emitting device, and
   a light absorbing layer comprising at least one of a first light absorbing member at a light exiting side of the first light emitting device and a second light absorbing member at a light exiting side of the second light emitting device, wherein
   a material of the first light absorbing member comprises N,N'-BIS(1-HEXYLHEPTYL)-PERYLENE-3,4:9,10-BIS(DICARBOXIMIDE), a material of the second light absorbing member comprises 4-(Dicyanomethylene)-2-tert-butyl-6-(1,1,7,7-tetramethyl-julolidin-4-yl-vinyl)-4H-pyran, the first light absorbing member is configured to absorb a portion of the light of the first color and the second light absorbing member is configured to absorb a portion of the light of the second color, an orthographic projection of the first light absorbing member on the substrate at least partially coincides with both an orthographic projection of the first light emitting device on the substrate and an orthographic projection of the second light emitting device on the substrate, and an orthographic projection of the second light absorbing member on the substrate at least partially coincides with both the orthographic projection of the first light emitting device on the substrate and the orthographic projection of the second light emitting device on the substrate.

2. The pixel unit of claim 1, wherein the first light absorbing member and the second light absorbing member are stacked in a direction perpendicular to the substrate.

3. The pixel unit of claim 1, further comprising a Thin Film Encapsulation (TFE) layer configured to encapsulate the first light emitting device, the second light emitting device and the third light emitting device, and the light absorbing layer is at a side of the TFE layer away from the first light emitting device, the second light emitting device and the third light emitting device.

4. The pixel unit of claim 1, wherein the first light emitting device, the second light emitting device and the third light emitting device comprise OLED devices.

5. The pixel unit of claim 1, wherein
   the first light emitting device comprises a first anode, a first light-emitting functional layer and a first cathode that are sequentially arranged in a direction away from the substrate, wherein the first light-emitting functional layer is configured to emit the light of the first color through the first cathode,
   the second light emitting device comprises a second anode, a second light-emitting functional layer and a second cathode that are sequentially arranged in a direction away from the substrate, wherein the second light-emitting functional layer is configured to emit the light of the second color through the second cathode, and
   the third light emitting device comprises a third anode, a third light-emitting functional layer and a third cathode that are sequentially arranged in a direction away from the substrate, wherein the third light-emitting functional layer is configured to emit the light of the third color through the third cathode.

6. The pixel unit of claim 1, further comprising at least one of a protective cover layer and a cover plate, wherein the protective cover layer and the cover plate are at a side of the light absorbing layer away from the substrate.

7. The pixel unit of claim 1, further comprising a fourth light emitting device, wherein the fourth light emitting device is configured to emit light of a fourth color, and luminance of the light of the fourth color is greater than luminance of the light of the third color, and wherein the light absorbing layer is further configured to absorb at least one of a portion of the light of the first color, a portion of the light of the second color and a portion of the light of the fourth color.

8. The pixel unit of claim 7, wherein the light of the fourth color comprises yellow light.

9. The pixel unit of claim 8, wherein the light absorbing layer comprises at least one of a first light absorbing member at a light exiting side of the first light emitting device, a second light absorbing member at a light exiting side of the second light emitting device and a third light absorbing member at a light exiting side of the fourth light emitting device, wherein the first light absorbing member is configured to absorb said portion of the light of the first color, the second light absorbing member is configured to absorb said portion of the light of the second color and the third light absorbing member is configured to absorb said portion of the light of the fourth color.

10. A display panel, comprising a plurality of pixel units according to claim 1.

11. The display panel of claim 10, wherein light absorbing layers of the plurality of pixel units are connected to form a layer structure.

12. A display device, comprising the display panel of claim 11.

* * * * *